United States Patent [19]

Tamechika et al.

[11] Patent Number: 5,712,572
[45] Date of Patent: Jan. 27, 1998

[54] INSULATION STATE MEASUREMENT METHOD, INSULATION STATE JUDGEMENT APPARATUS, AND DISPERSION TYPE POWER GENERATING SYSTEM USING THE SAME

[75] Inventors: Masanari Tamechika; Kimitoshi Fukae, both of Nara, Japan

[73] Assignee: Canon Kabushiki Kaisha, Tokyo, Japan

[21] Appl. No.: 429,228

[22] Filed: Apr. 25, 1995

[30] Foreign Application Priority Data

Apr. 30, 1994 [JP] Japan ................................. 6-114110
Apr. 14, 1995 [JP] Japan ................................. 7-089286

[51] Int. Cl.$^6$ .................................................. H01H 31/12
[52] U.S. Cl. .......................................... 324/551; 324/509
[58] Field of Search ................................ 324/509, 527, 324/522, 528, 529, 544, 551

[56] References Cited

U.S. PATENT DOCUMENTS

| | | | |
|---|---|---|---|
| 4,206,398 | 6/1980 | Janning | 324/51 |
| 4,638,245 | 1/1987 | MacPhee et al. | 324/51 |
| 4,810,972 | 3/1989 | Appleby, Jr et al. | 324/551 |
| 4,896,115 | 1/1990 | LeMaitre et al. | 324/551 |
| 5,155,441 | 10/1992 | Zelm | 324/551 |

FOREIGN PATENT DOCUMENTS

| | | |
|---|---|---|
| A0311376 | 4/1989 | European Pat. Off. |
| 4109586A1 | 9/1992 | Germany |
| 57-119264 | 1/1981 | Japan |
| 4166773 | 6/1992 | Japan |
| 681410 | 10/1994 | Japan |

Primary Examiner—Louis M. Arana
Attorney, Agent, or Firm—Fitzpatrick, Cella, Harper & Scinto

[57] ABSTRACT

An object of the present invention is to provide an insulation state measurement method and a judgement apparatus for a power conversion system, which can monitor the insulation state of an electric path with one end to which a power source is connected, or the power source itself in a non-use state of the power source, and can prevent an unexpected failure.

A solar cell array connected to one end of an electric path is set in a non-grounded state upon operation of a change-over switch, and a measurement switch which receives an operation command from an operating circuit temporarily applies a high voltage to the electric path. A current detector detects a weak current flowing through connection lines, and supplies detection data to an insulation judgement unit. The insulation judgement unit calculates the insulator resistance on the basis of the magnitude of the applied voltage, and the magnitude of the weak current detected by the current detector. If an abnormality is detected, information indicating the abnormality is displayed on a display unit. In this manner, an unexpected failure can be avoided.

21 Claims, 11 Drawing Sheets

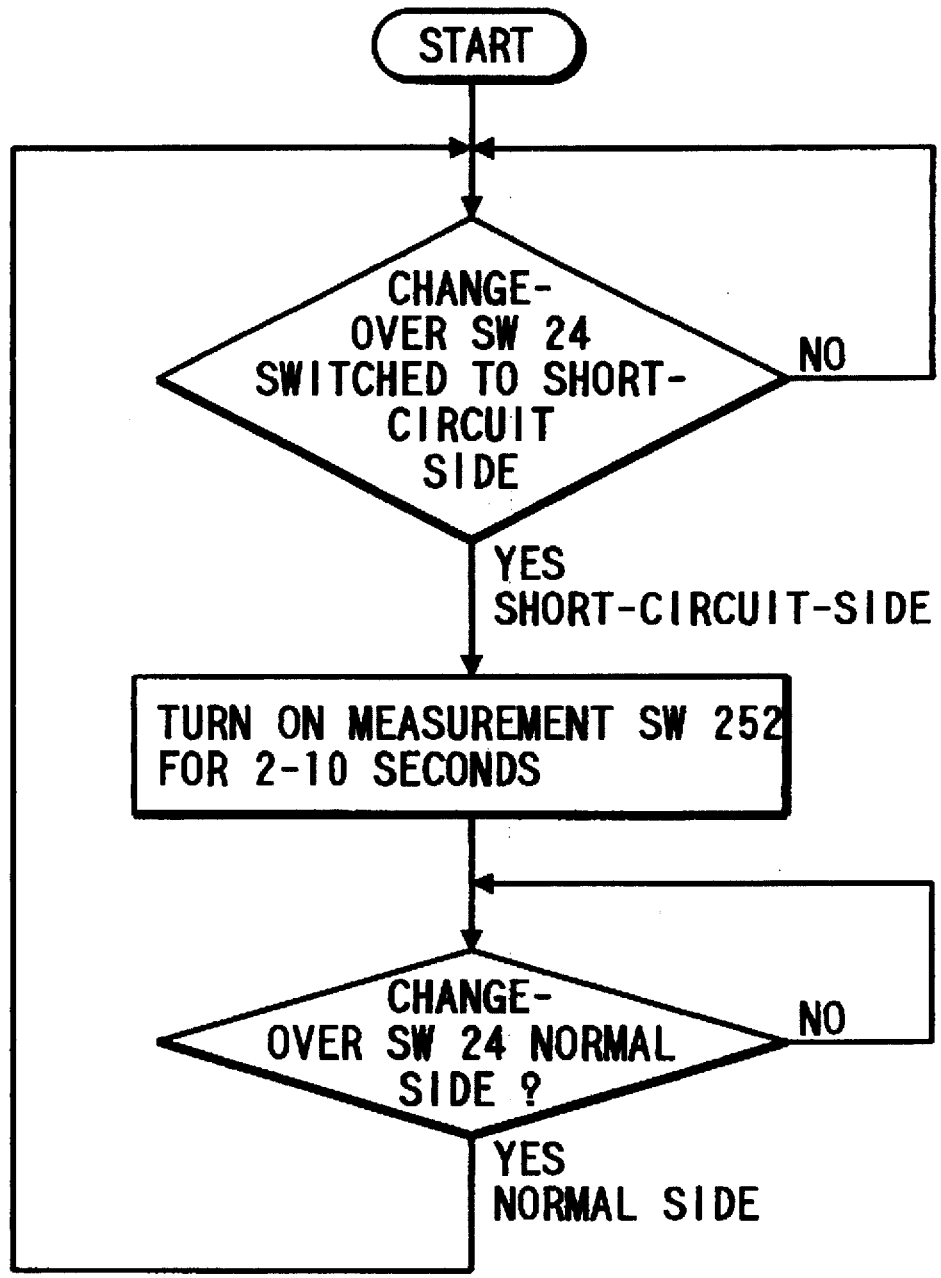

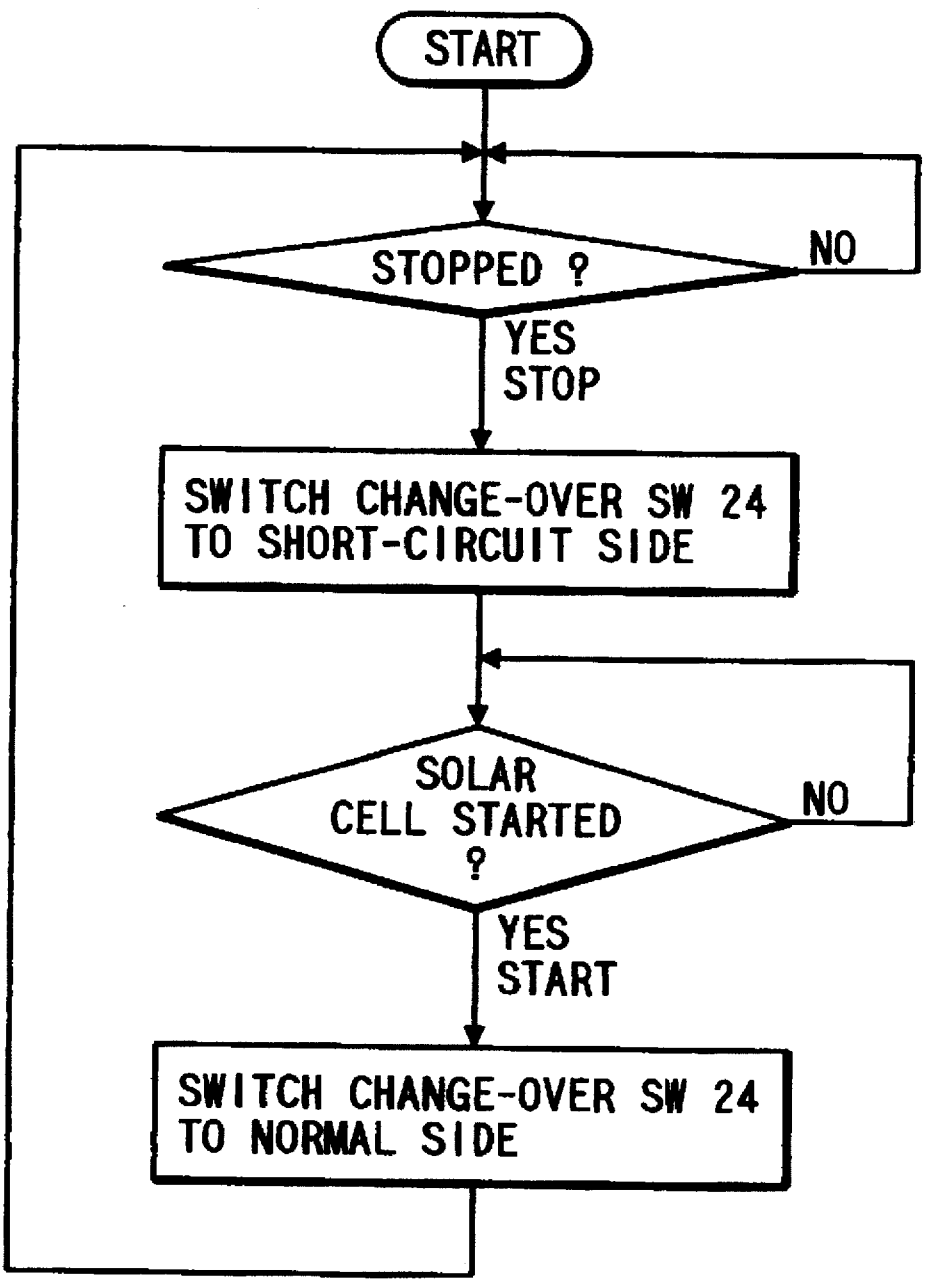

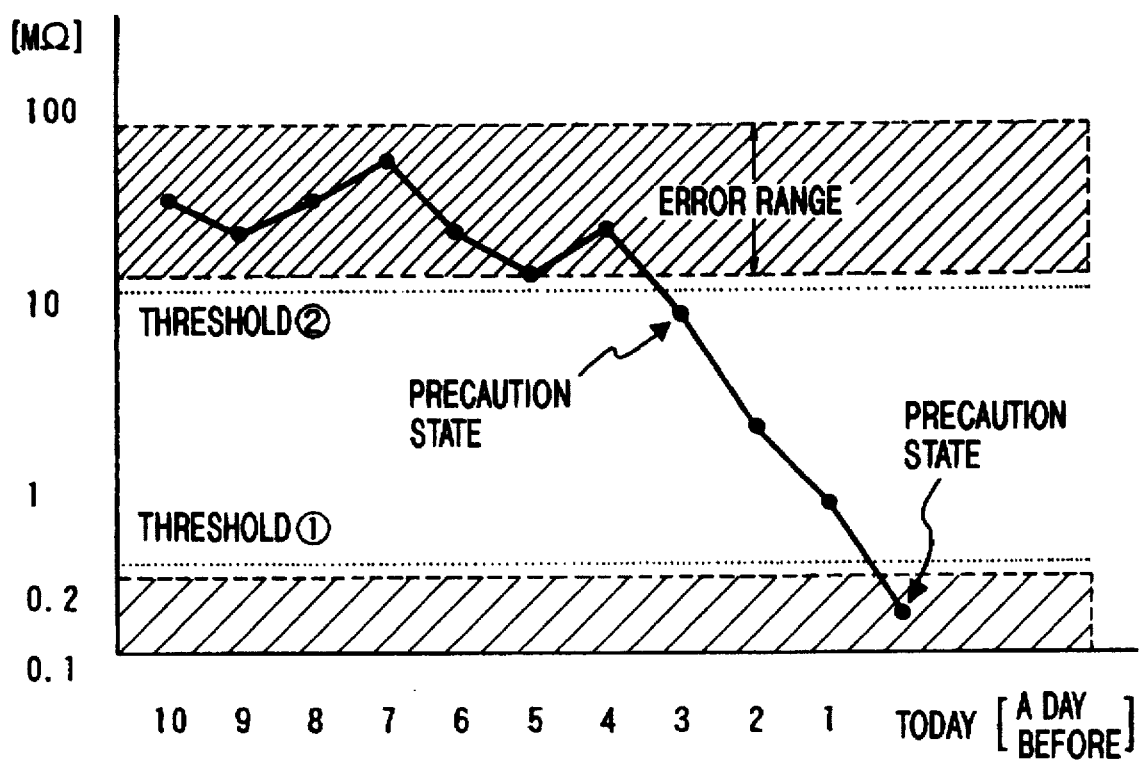

INSULATION STATE MEASUREMENT METHOD, INSULATION STATE JUDGEMENT APPARATUS, AND DISPERSION TYPE POWER GENERATING SYSTEM USING THE SAME

BACKGROUND OF THE INVENTION

1. Field of the Invention

The present invention relates to a method of measuring the insulation state of a power source and an apparatus for judging the insulation state and, more particularly, to a power conversion system which is represented by a dispersion type power generating system, especially, a solar light power generating system, and has an electric path which becomes a non-grounded state under a predetermined condition and, more specifically, to a measurement method and a judgement apparatus for the insulation state of an electric path and a power supply in a non-use state of a dispersion type power source, and a dispersion type power generating system using the same.

2. Related Background Art

In recent years, upon an increase in power demand, a system linkage dispersion type power generating system which has a role of compensating for a large-scale power plant has especially received a lot of attention. However, in order to operate such a dispersion type power generating system, the system must always be strictly checked, as defined in the Electric Equipment Technical Standards. When the power generating system is independently used, it is preferable to strictly check the system all the time.

In order to promote widespread use of the dispersion type power generating system as a household appliance, the system must stably supply electric power and must be kept safe without requiring any special attendance of a user. For this purpose, a power conversion system with such a function is required.

FIG. 12 shows an example of a solar light power generating system based on a power conversion system for detecting a DC earth fault.

A linkage protection unit 108 as a means for making an inverter circuit 102 inoperative upon occurrence of a failure (earth fault) is inserted in an electric path 103 for connecting a solar cell array 101 as a DC power source and the inverter circuit 102 constituting a power conditioner 109 as a power conversion system.

As a means for detecting a DC earth fault, two voltage dividing resistors 104 with the same resistance are connected between two electric lines of the electric path 103, and a current detector 105 is inserted in a ground line extending from the voltage dividing point of the resistors. An earth fault current judgement circuit 106 is connected to the current detector 105, and operates upon reception of an output from the current detector 105. An inverter control circuit 107 operates in accordance with an output from the earth fault current judgement circuit 106, thereby monitoring the presence/absence of an earth fault of at least one line of the electric path 103.

However, in the above-mentioned arrangement of the solar light power generating system, an abnormality of the solar cell array 101 or the electric path 103 can be detected only after an earth fault current has already flowed, i.e., the panel of the solar cell array 101 as a power source or a charged portion of its wiring has already suffered a ground fault. In addition, when a circuit is grounded at an intermediate potential between + and − levels of the solar cell array 101, detection itself is disabled. Therefore, the danger of a ground fault cannot be predicted in the conventional system.

SUMMARY OF THE INVENTION

The present invention has been made to solve the conventional problems, and has as its object to provide an insulation state measurement method and judgement unit, which can monitor the insulation state of an electric path to one end of which a power source is connected or the insulation state of the power source itself in a non-use state of the power source, and can prevent an unexpected failure, and a dispersion type power generating system using the same.

In order to achieve the above object, according to the present invention, there is provided an insulation state measurement method comprising:

the power source short-circuit step of short-circuiting a power source connected to power conversion means via an electric path;

the high-voltage applying step of applying a voltage across the electric path and a grounded point after the power source is short-circuited; and the current measurement step of measuring a current which flows based on the applied voltage, wherein an insulation state of the electric path or the power source is measured based on the current. There is also provided an insulation state judgement device comprising:

short-circuit means for short-circuiting an electric path having one end to which a power source is connected;

voltage applying means for applying a voltage across a closed circuit formed by the short-circuit means and having the electric path, and a grounded point;

current detection means for detecting a current flowing at the grounded point; and insulation state judgement means for measuring a conductive state on the basis of an output value from the current detection means. There is also provided a power conversion system comprising:

an electric path which has one end to which a power source is connected, and short-circuits the power source in a non-grounded state upon operation of short-circuit means;

voltage applying means for applying a voltage across the short-circuit means, the electric path, and a grounded point;

a connection line for connecting the voltage applied by the voltage applying means to a point between the electric path and the grounded point;

current detection means for detecting a current of the connection line;

operating means for operating the voltage applying means after the short-circuit means is operated; and insulation judgement means for judging an insulation state of the electric path or the power source upon reception of an output from the current detection means.

Therefore, according to the principal arrangement of the present invention, a high voltage is applied to the electric path after the electric path of, e.g., a dispersion type power source connected to one end of the electric path is set in a short-circuit state. A current flowing at that time is detected, and the insulation state of the dispersion type power source and its wiring lines is measured and judged based on the magnitude of the detected current. If the judgement result indicates an abnormality, information indicating it is displayed, and thereafter, a user can remove the poor insulation portion as needed, thereby avoiding an unexpected failure. Note that an unexpected failure can be sufficiently avoided when voltage application and measurement using, e.g., a measurement switch are performed once every night.

BRIEF DESCRIPTION OF THE DRAWINGS

FIG. 8 is a flow chart showing the operation of an operating unit used in the present invention;

FIG. 9 is a flow chart showing the operation of a change-over switch control unit preferably used in the present invention;

FIG. 10 is a graph showing a setting example of the threshold of an insulator resistance;

FIG. 11 is a table for explaining standard values of insulator resistances; and

DETAILED DESCRIPTION OF THE PREFERRED EMBODIMENTS

The present invention will be described below with reference to the accompanying drawings.

Figure 1:
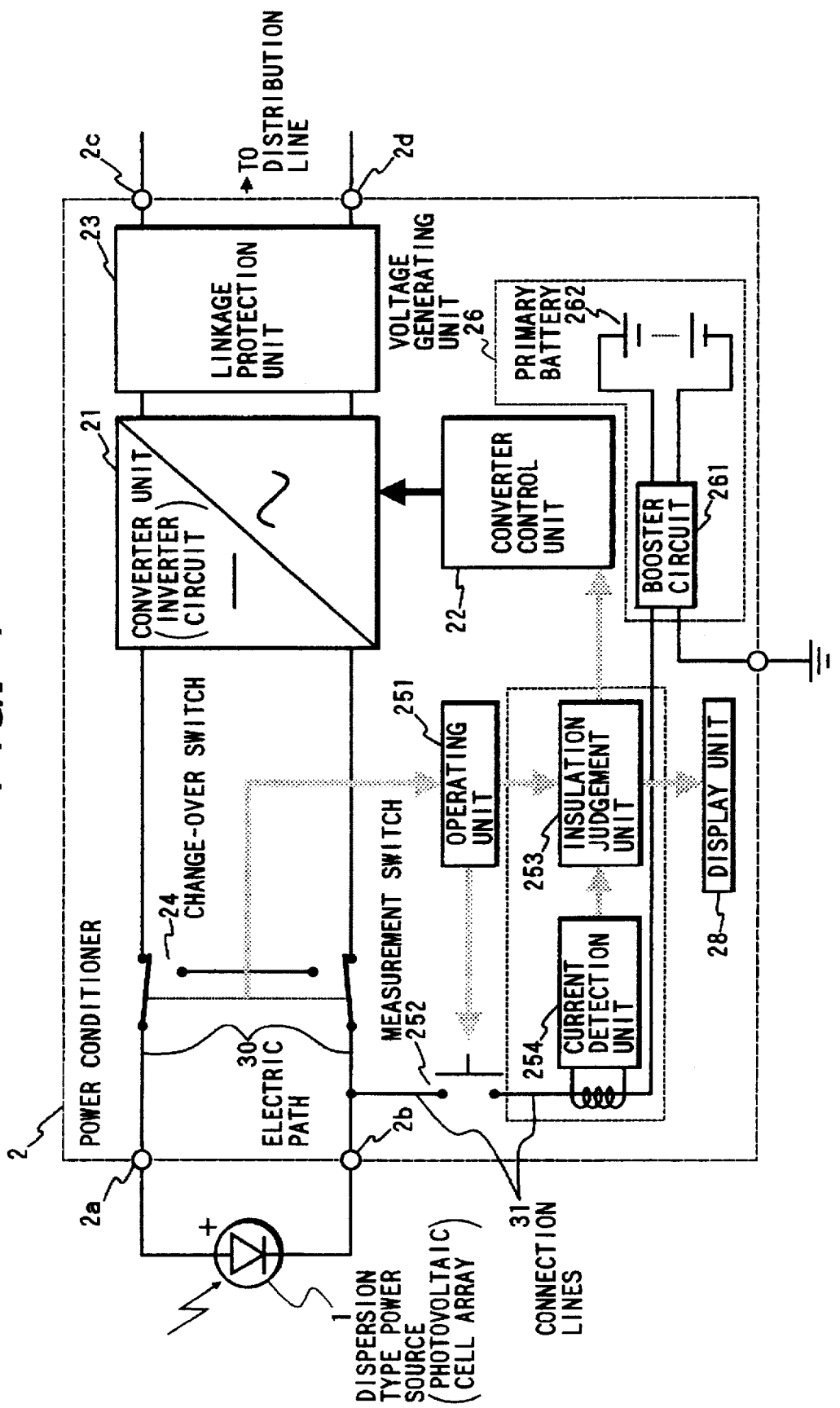
FIG. 1 is a preferred block diagram showing the arrangement of the present invention.

FIG. 1 is a block diagram showing a preferred system linkage dispersion type power generating system using the present invention.

Dispersion Type Power Source 1

A dispersion type power source may comprise either a DC power source such as a solar cell or an AC power source such as a wind power generator as long as it can supply electric power to a load. Alternatively, the dispersion type power source may comprise a fuel cell or a diesel power generator, which can supply a stable electric power.

More specifically, a solar cell array constituted by electrically series-parallel connecting a plurality of solar cell modules is preferably used.

Power Conditioner 2

A power conditioner 2 is an apparatus for converting an input electric power into electric power to be used, as needed.

When solar cells are used in dispersion type power generation, an apparatus which can convert DC electric power into AC electric power which is generally used in home, and can connect the converted electric power to an AC system, is preferable. Some power generating systems may convert a voltage of an input DC electric power into another voltage, and may output the converted voltage.

Converter Unit 21

A converter unit 21 is a circuit for converting an input electric power into another type of electric power. When the dispersion type power source 1 comprises a solar cell array, an inverter circuit for performing DC/AC conversion is exemplified. Alternatively, a DC/DC converter circuit may be used.

Furthermore, an AC/AC converter circuit may be used in correspondence with the dispersion type power source 1 used.

More specifically, the converter unit 21 is constituted using a GTO (Gate Turn Off) thyristor, an IGBT (Insulated Gate Bipolar Transistor), a Power MOSFET, or the like as a power device.

Converter Control Unit 22

The converter control unit 22 controls the converter unit 21. More specifically, an inverter control circuit as the converter control unit preferably has a function of stopping the inverter circuit 21 in response to an instruction from an insulation judgement unit 253, in addition to its normally required function such as a function of linking to a system. In this case, the converter control unit 22 can comprise a CPU, and the like.

Linkage Protection Unit 23

A linkage protection unit 23 automatically disconnects a system and the dispersion type power source 1 from each other when the electric power output from the inverter circuit as the converter unit 21 exceeds the electric power performance range in which linkage to the system is attained.

When the linkage protection unit 23 electrically disconnects the dispersion type power source 1, it may be arranged on the system side of the converter unit 21 in the power conditioner 2, or may be arranged between the dispersion type power source 1 and the converter unit 21. Furthermore, the linkage protection unit 23 may also serve as a power distribution breaker unit which is arranged outside the power conditioner 2, and utilizes a breaker arranged between a normal commercial electric power and a load.

Change-over Switch 24

A change-over switch 24 electrically changes over an operation state between a normal operation state and an insulator resistance measurement state. In the insulator resistance measurement state, the inverter circuit 21 as the converter unit is disconnected from its input so as to protect the converter unit.

Operating Unit 251

An operating unit 251 outputs an operation command signal for starting the measurement of insulator resistances. The operation unit 251 preferably has a circuit arrangement in which it checks if the change-over switch 24 is changed over to the insulator resistance measurement state, and does not output any signal if the change-over switch 24 is not changed over to the insulator resistance measurement state.

This circuit comprises, e.g., a comparator circuit, and the like.

Measurement Switch 252

A measurement switch 252 electrically connects the dispersion type power source 1, which forms a closed circuit by the change-over switch 24, and the voltage generating unit in response to the operation command signal from the operating unit 251, and applies a high voltage to an electric path 30.

Insulation Judgement Unit 253

An insulation judgement unit 253 judges the insulation state of the dispersion type power source 1 and the electric path 30 which forms a closed circuit.

More specifically, a current detector measures the magnitude of a weak current which flows between the electric path 30 and ground, and the insulation judgement unit 253 judges the insulation state by comparing the obtained measurement result with a value pre-stored in, e.g., a ROM.

The insulation judgement unit 253 may be constituted integrally with the operating unit 251, the current detector, and the like.

Voltage Generating Unit 26

A voltage generating unit 26 applies a high voltage to, e.g., the electric path 30 so as to judge the insulation state. The voltage generating unit utilizes, as a voltage generating power source, a manganese or lithium battery as a primary battery 262, a lead storage battery, lithium ion battery, or the like as a secondary battery, or the power source of the system. When the voltage output from the voltage generating power source is too small to judge the insulation state, it is controlled to an appropriate voltage value using a booster circuit 261.

Figure 2:
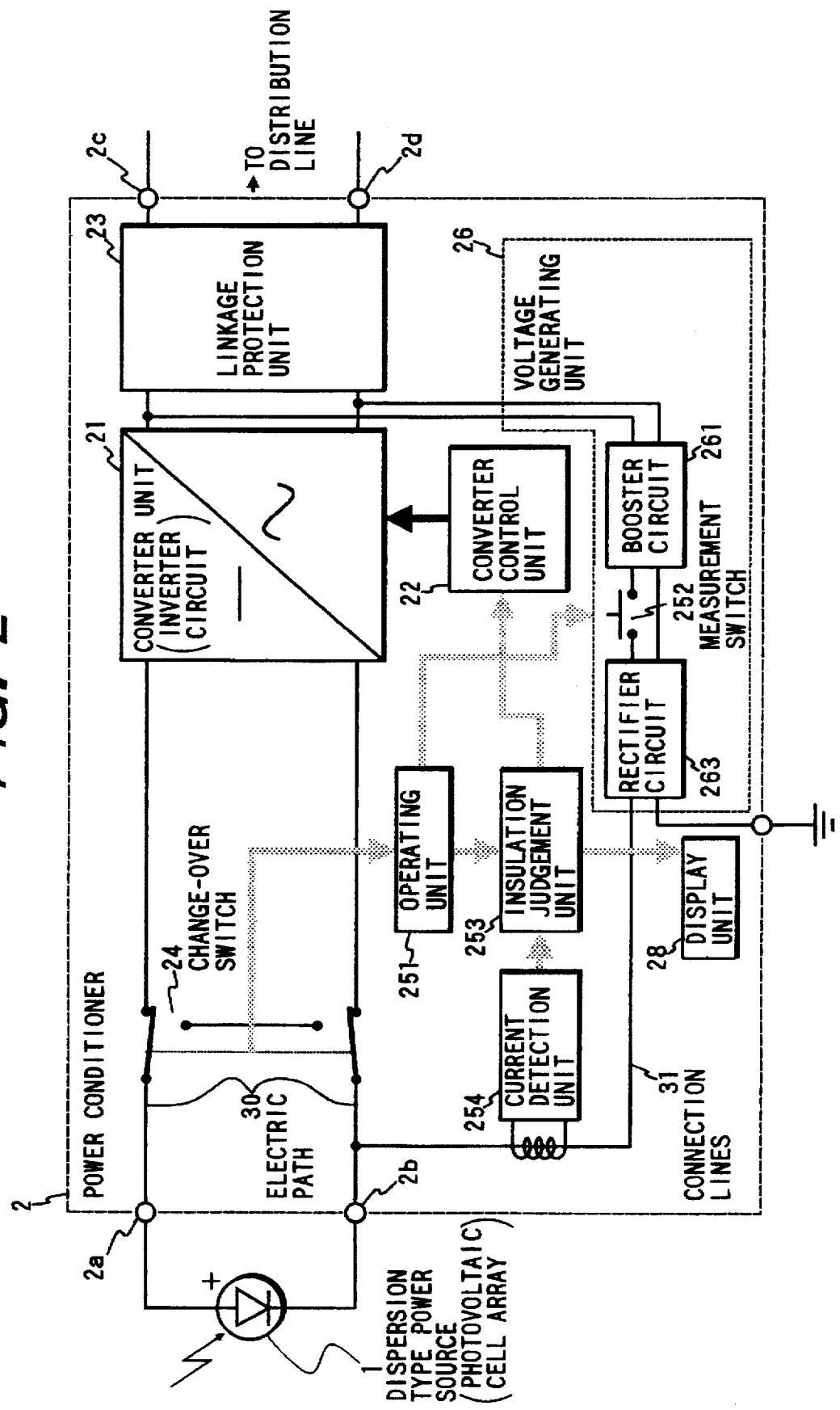
FIG. 2 is a preferred block diagram showing the arrangement using a linkage power source as a voltage generating unit of the present invention.

When an AC power source such as the system power source is utilized as the voltage generating power source, as shown in FIG. 2 the voltage generating unit 26 preferably comprises a rectifier circuit 263 (FIG. 2) as a circuit for converting an AC voltage into a DC voltage. Note that the applied voltage may be either a DC or pulse voltage. If the device for measuring the insulation state has high precision, high voltages (100 to 2,000 V) need not be applied.

Voltage Detectors 271 and 272 (FIG. 2)

Figure 4:
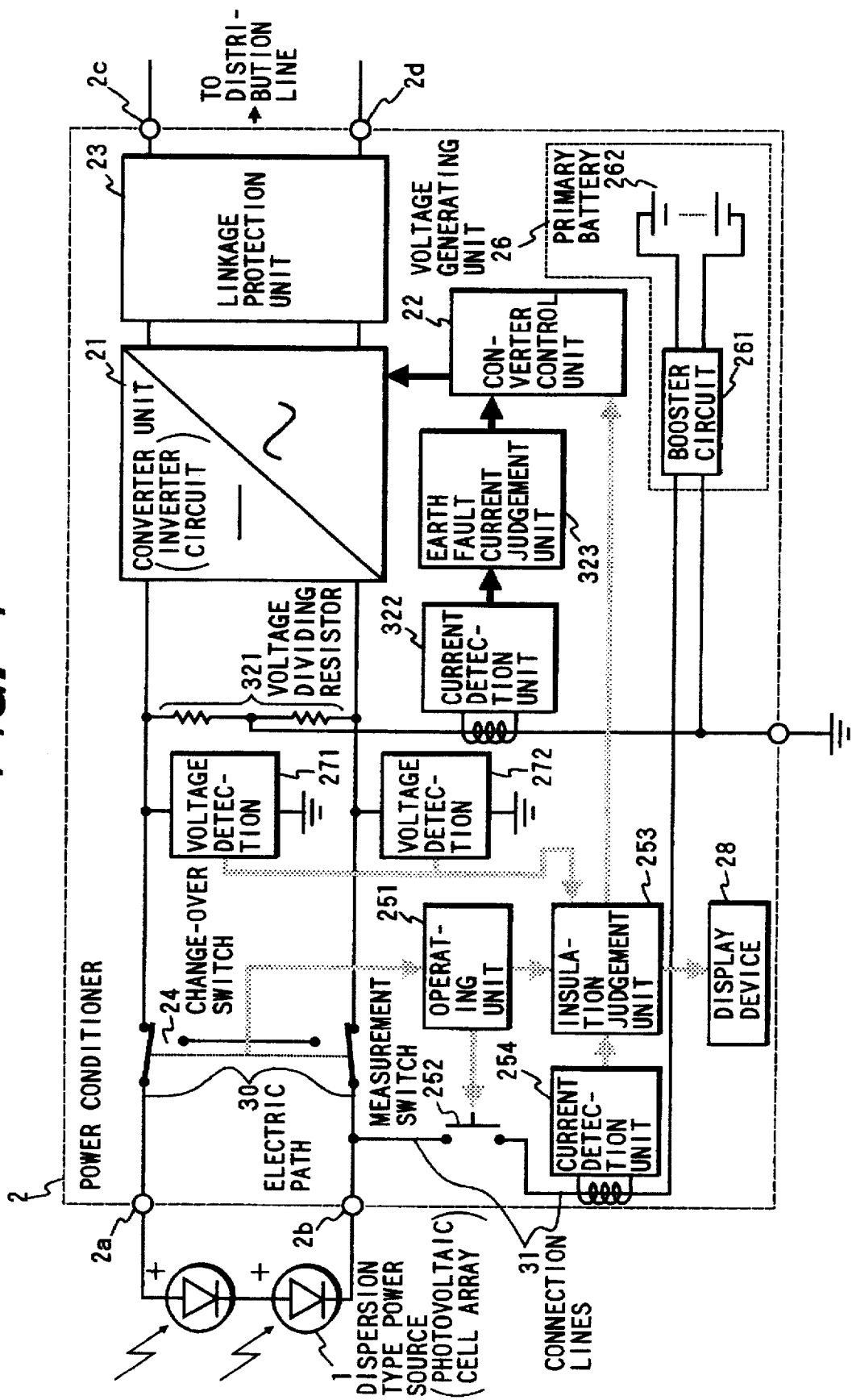
FIG. 4 is a block diagram showing still another arrangement of the present invention.

These detectors shown in FIG. 4 specify or determine the location of a poor insulation portion or a portion where the insulator resistance or insulation resistance is lowered.

Display Unit 28

When a poor insulation state is detected, the display unit 28 displays a message indicating this, thereby generating an alarm.

In some cases, the display unit 28 may display an alarm message indicating that the insulator resistance is lowered although a poor insulation state may not have occurred.

The display unit 28 may comprise an LED or may comprise a liquid crystal display or an electron beam display.

Figure 5:
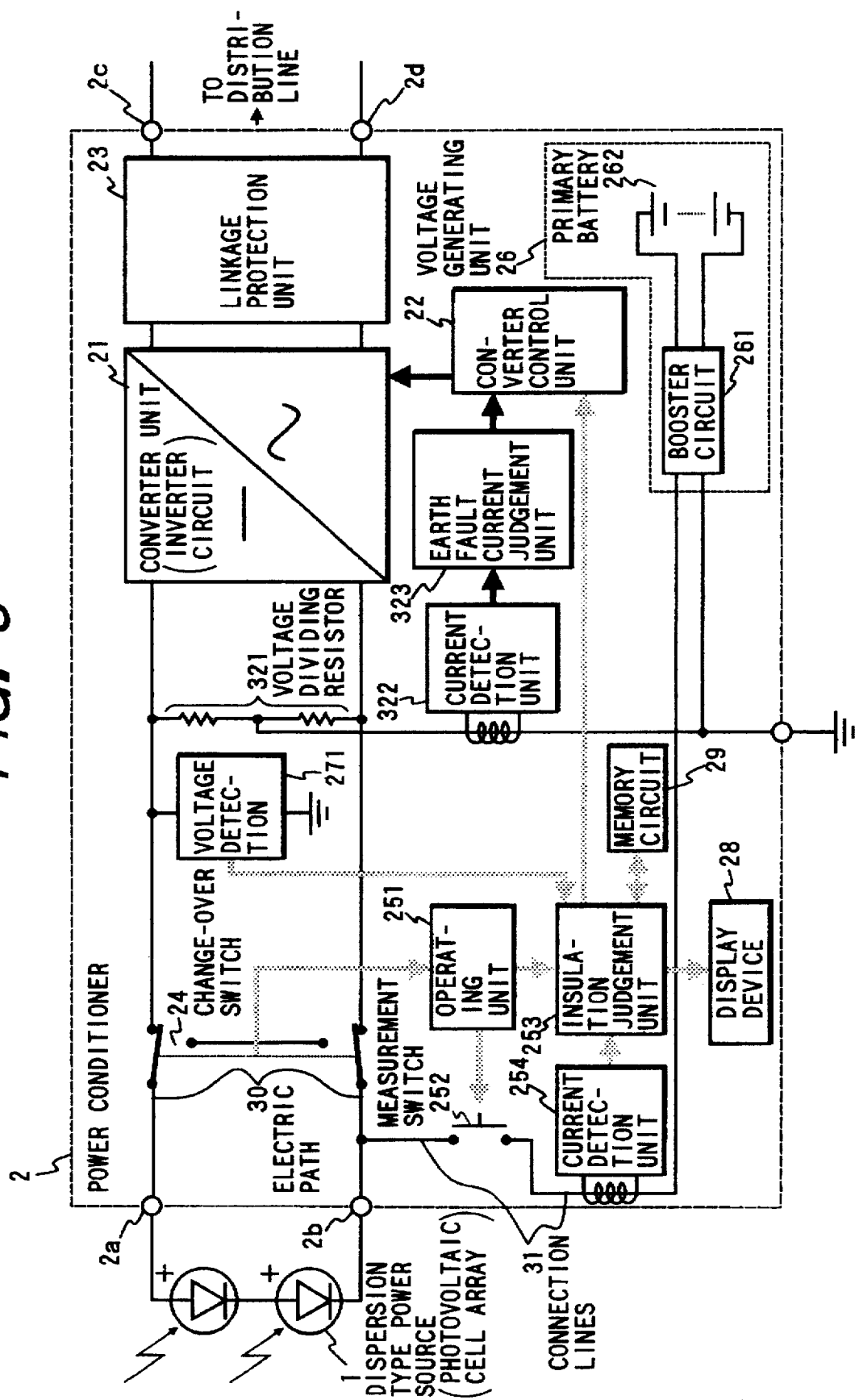
FIG. 5 is a block diagram showing still another arrangement of the present invention.

Memory Circuit 29 (FIG. 5)

A memory circuit 29 shown in FIG. 5 stores the insulator resistance or the current value of the weak current at the time of occurrence of a poor insulation state so as to determine the location of a poor insulation portion later after an elapse of a predetermined period of time.

More specifically, the memory circuit 29 comprises a semiconductor memory, a magnetic storage device, or the like.

Electric Path 30

The electric path 30 supplies electric power from the solar cell array 1 to the converter unit 21.

In the insulation state measurement mode, the electric path 30 is disconnected from the converter unit 21, and a high voltage is applied to the electric path 30.

Connection Lines

Connection lines 31 are used for supplying a high voltage to the electric path 30.

Figure 3:
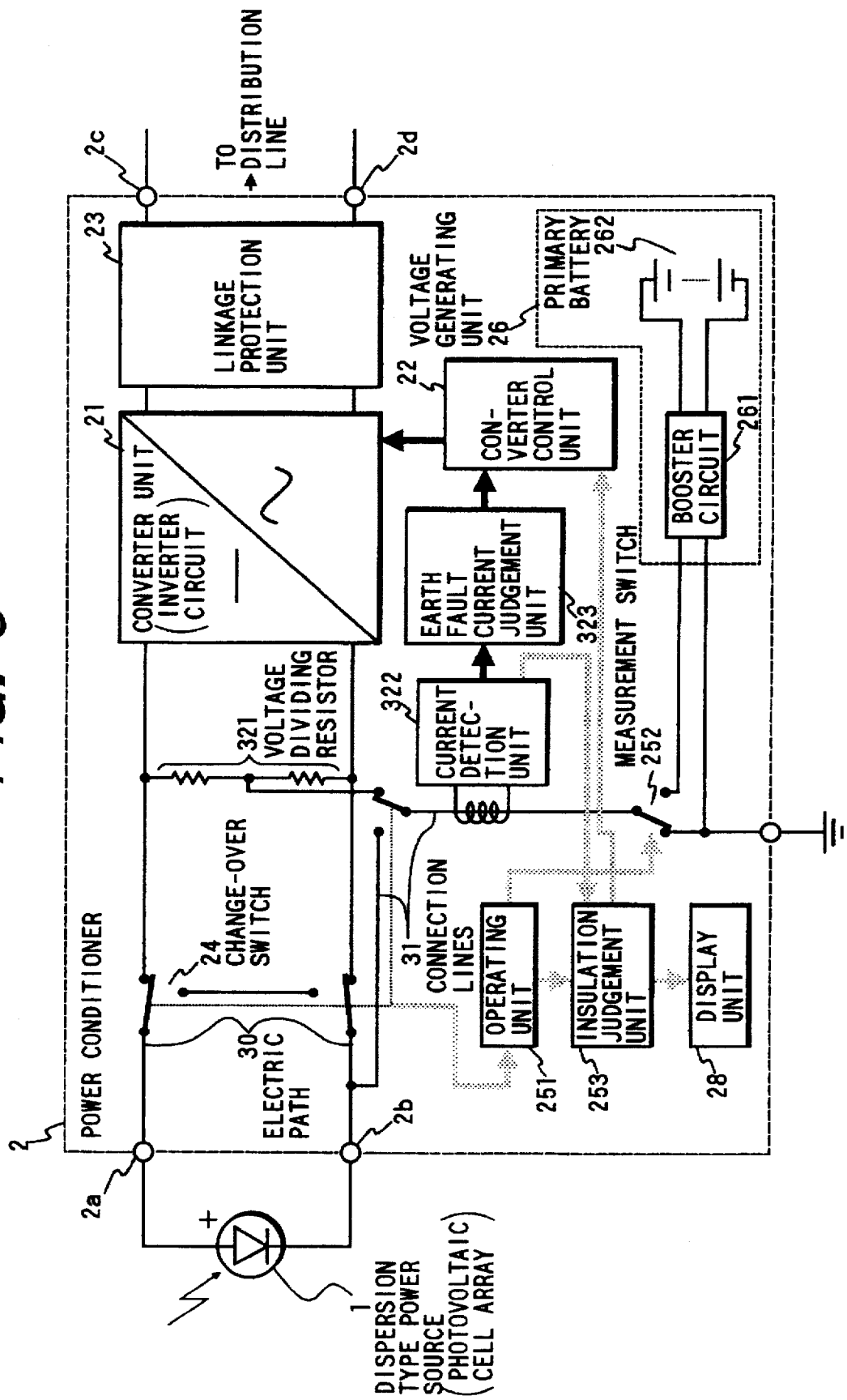
FIG. 3 is a block diagram showing another arrangement of the present invention.

Voltage Dividing Resistor 321 (FIG. 3)

A voltage dividing resistor 321 shown in FIG. 3 detects an earth fault of an input DC power source.

The voltage dividing resistor 321 comprises two resistors with the same resistance.

Current Detector 322 (FIG. 3)

A current detector 322 shown in FIG. 3 measures an earth fault current which flows when an input DC power source causes an earth fault.

The current detector 322 may be commonly used as a current detector for measuring a weak current flowing through the connection lines 31, as will be described later in Embodiment 3.

Earth Fault Current Judgement Unit 323 (FIG. 3)

An earth fault current judgement unit 323 shown in FIG. 3 checks the detection level from the current detector 322 to judge if an earth fault has occurred.

Embodiment 1

FIG. 1 shows a solar light power generating system as a dispersion type power generating system to which the present invention is applied.

The system will be described below with reference to FIG. 1.

A solar cell array 1 serving as a power source inputs DC electric power to an inverter circuit of a converter unit 21 constituting a power conditioner 2 as a power conversion unit via an electric path 30. After the DC electric power is converted into AC electric power, the AC electric power is supplied to distribution lines via output terminals 2c and 2d. The power conditioner 2 normally includes an inverter circuit for converting DC electric power into AC electric power when the power source outputs DC electric power (an AC-AC converter is used when the power source outputs AC electric power), an inverter control circuit as a converter control unit 22 for controlling the inverter circuit serving as the converter unit 21, and a linkage protection unit 23 for system linkage.

Furthermore, a two-circuit interlocking type change-over switch 24, which comprises, e.g., a relay, a semiconductor relay, or the like, is inserted in the electric path 30 for connecting the solar cell array 1 and the inverter circuit. During nighttime in which the solar cell array 1 does not function or when power generation is stopped by shielding light incident on the solar cell array to perform judgement, the change-over switch 24 short-circuits input terminals 2a and 2b, and disconnects the solar cell array 1 from the inverter circuit 21. The change-over switch 24 may be controlled to be short-circuited when the inverter circuit 21 stops, and may be controlled to connect the inverter circuit 21 when the inverter circuit 21 is started by another means. The change-over switch 24 may be manually switched as needed.

A measurement switch 252, which comprises, e.g., a relay, a semiconductor relay, or the like, is inserted in one line of the electric path 30. The measurement switch 252 is controlled to be kept OFF in a normal state (i.e., when the solar cell array 1 is used), and is controlled to be turned on in response to an operation command from an operating unit 251. The measurement switch 252 is connected to a high-voltage generating power source (voltage generating unit) 26. In this embodiment, the voltage generating unit 26 comprises a primary battery 262, and a booster circuit 261 which boosts the voltage output from the primary battery 262, and has one grounded line. The voltage generating unit 26 is connected to the electric path 30 via connection lines 31 for a time period required for judgement. Since the judgement is made under a condition that the change-over switch 24 is short-circuited, the operating unit 251 outputs an operation command after the change-over switch 24 is short-circuited.

If the operating unit 251 comprises a timer circuit, and outputs an operation command for about 5 seconds at, e.g., 12 o'clock every night, insulation judgement can be prevented from being performed several times in a day, and waste of the primary battery 262 can be prevented. Therefore, such an arrangement is desirable. Of course, the measurement switch 252 may be manually depressed when the change-over switch 24 is short-circuited.

In this embodiment, the booster circuit 261 boosts a voltage from the primary battery 262. In place of the primary battery, an accumulation type secondary battery, a power source from another distribution system, another power generating system, or the like may be used.

When the measurement switch 252 is closed, a current detector 254 detects a weak current flowing through the connection lines 31, and supplies the detection data to an insulation judgement unit 253 comprising, e.g., an operational amplifier, a comparator, and the like. The insulation judgement unit 253 calculates the insulator resistance on the basis of the magnitude of a voltage applied from the voltage generating unit 26 and the magnitude of the weak current detected by the current detector 254. If the calculated insulator resistance is smaller than a standard value, the insulation judgement unit 253 supplies information indicating this to the inverter control circuit 22, and also supplies the information to a display unit 28 to display a corresponding message. (Note that the standard value of the insulator resistance is a value defined by the Japanese Electric Equipment Technical Standard Article 1, and is preferably defined, as shown in FIG. 11.)

If the voltage applied from the voltage generating unit 26 is always constant, the insulation judgement unit 253 need not calculate the insulator resistance, but can judge the insulation state based on only the magnitude of the weak current detected by the current detector 254. In this case, since the apparatus can be easily realized in terms of circuit design, a simple apparatus structure which is free from failures can be achieved with low cost. When the insulator resistance is smaller than the standard value, the change-over switch 24 is controlled not to be switched, so that the inverter control circuit 22 does not start the inverter circuit 21 the next morning when the solar cell array 1 should normally output electric power, and a failure mode is started.

FIG. 10 shows a change in insulator resistance within a day when a poor insulator resistance state occurs gradually. In this case, if the standard value is set to be a first threshold (1), by setting a second threshold (2), an unexpected failure can be avoided more reliably. When the system is initially installed, the insulator resistance in the system is measured and is stored as an initial value. Since the insulator resistance considerably varies depending on the measurement state, an error range is determined by calculations, and a line which exceeds the error range for the stored initial insulator resistance is determined to be the threshold (2).

When the measured insulator resistance falls within a range defined between the thresholds (2) and (1), such a state is determined as a precaution state so as not to start the failure mode. In this state, only an alarm message is displayed. Therefore, the cell array 1 can be normally operated.

In this manner, the insulator resistance of the solar cell array 1 and the connected electric path 30 is measured periodically (every night), and when an abnormality is detected, the input terminals 2a and 2b are short-circuited to stop generation of a voltage, thereby protecting the apparatus, and the like. At the same time, the display unit 28 can display an alarm message for a user or the like, or an alarm message can be sent to an equipment manager or the like via a telephone line. In particular, when resin-encapsulated solar cells are used, an earth fault often progresses gradually, and the present invention is especially effective for such a case.

In this embodiment, a system linkage system has been exemplified as the power generating system. However, the present invention can also be applied to a non-linked independent system.

Figure 7:
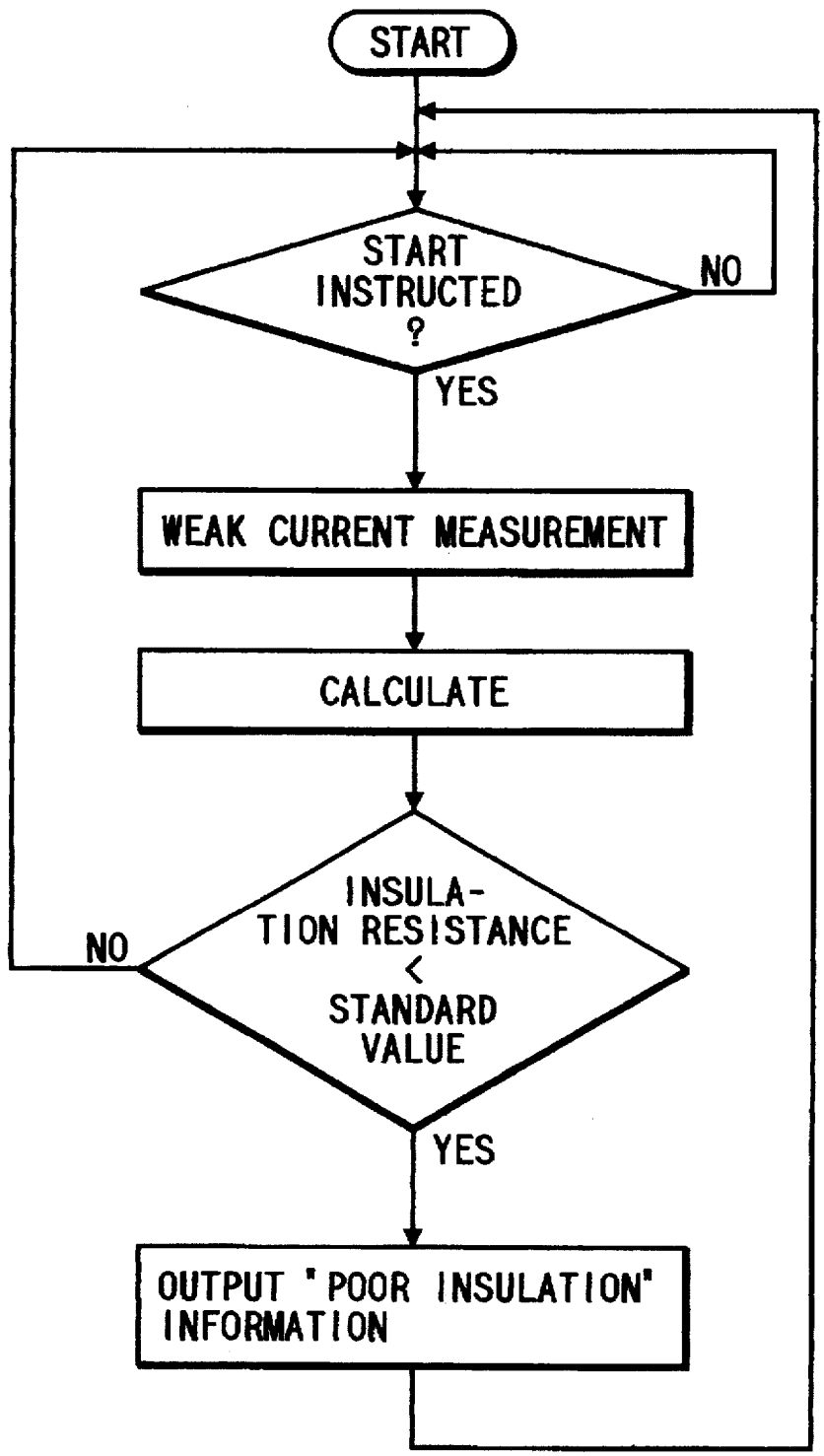
FIG. 7 is a flow chart showing the operation of an insulation judgement unit used in the present invention.
Figure 12:
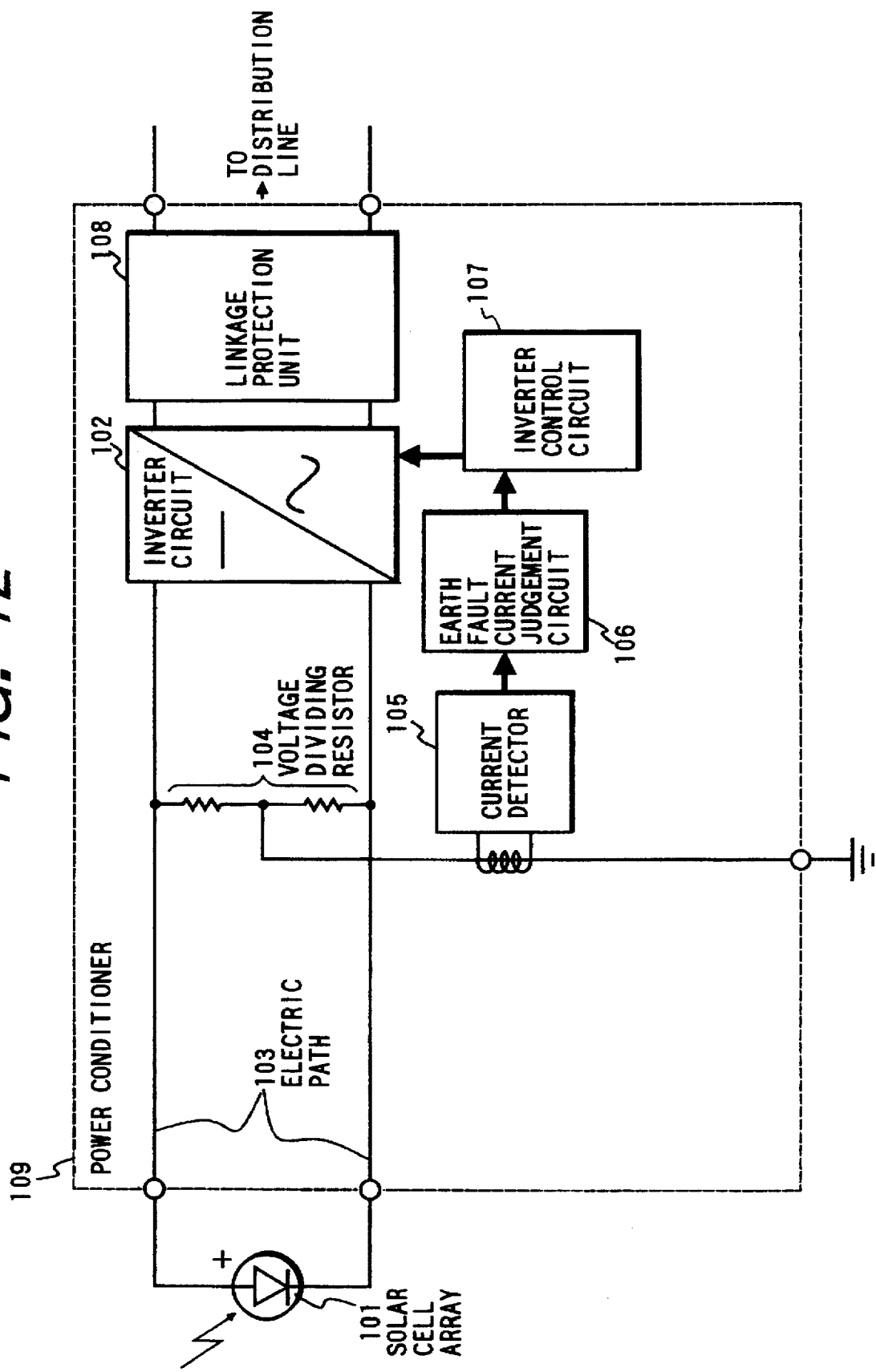
FIG. 12 is a block diagram showing the arrangement of a solar light power generating system as a power conversion system for the purpose of a comparison with the present invention.

Note that FIGS. 7, 8, and 9 are flow charts showing the control operations of the insulation judgement unit, the operating unit, and the change-over switch for operating the solar cell array.

Embodiment 2

FIG. 2 shows another embodiment of a solar light power generating system to which the present invention is applied.

In Embodiment 2, in the arrangement of the voltage generating unit 26, the primary battery 262 in Embodiment 1 is replaced by a voltage obtained by rectifying an AC voltage on the system side by a rectifier circuit 263. In Embodiment 2, the voltage generating unit 26 can always be stably used as a high-voltage generating power source. The arrangement of this embodiment does not require exchange of any battery serving as the voltage generating power source.

In this embodiment, the measurement switch 252 is arranged in the voltage generating unit 26 in place of the position on the connection lines 31. With this arrangement, the object of the present invention can be achieved. The same applies to Embodiment 1, and the measurement switch 252 can be arranged at a position other than that on the connection lines 31 as long as it can achieve a function as a voltage applying means for applying a high voltage across the electric path 30 and a grounded point.

Other operations are the same as those in Embodiment 1.

Embodiment 3

FIG. 3 shows still another embodiment of a solar light power generating system to which the present invention is applied.

In this embodiment, since the change-over switch 24 is changed from a two-circuit interlocking type to a three-circuit interlocking type, and the measurement switch 252 adopts a change-over type switch, a current detector 322 for detecting an earth fault current can also be used as a detector for detecting the insulator resistance.

During, e.g., nighttime in which the solar cell array 1 does not function, the change-over switch 24 short-circuits the input terminals 2a and 2b to disconnect the solar cell array 1 from the inverter circuit 21 as the converter unit, and to ground it via the current detector 322.

In a normal state, the measurement switch 252 is connected to the ground side, and when the switch 252 receives an operation command from the operating unit 251, a high voltage from the voltage generating unit 26 is applied to the electric path 30. The voltage generating unit 26 is connected for a time required for judgement of the electric path 30.

The measurement time is preferably 2 to 10 seconds although it depends on the precision of detectors and the arrangement of the power source.

The current detector 322 detects a weak current which flows at that time, and supplies detection data to the insulation judgement unit 253. The insulation judgement unit 253 calculates the insulator resistance on the basis of the applied voltage and the detected weak current. If the calculated insulator resistance is smaller than the standard value, the unit 253 supplies information indicating this to the converter control unit 22, and also supplies the information to the display unit 28 to display a corresponding message. As in Embodiment 1, when the insulator resistance is smaller than the standard value, the solar cell array 1 is kept grounded without switching the change-over switch 24, thus setting a failure mode.

The operations of a voltage dividing resistor 321, the current detector 322, and an earth fault current judgement unit 323 in a normal state are controlled in the same manner as those of a voltage dividing resistor 104, a current detector 105, and an earth fault judgement unit 106 described in a comparative example.

Since Embodiment 3 can commonly use the current detector 322 for earth fault judgement as the current detector 254 in Embodiments 1 and 2, it can reduce cost accordingly. In addition, the cooperation with the earth fault current judgement unit 323 which operates upon occurrence of an earth fault can be attained, resulting in a convenience. Furthermore, since the solar cell array 1 can be grounded upon occurrence of a failure, this embodiment can improve safety as compared to Embodiments 1 and 2.

In each of Embodiments 1 and 2, the insulator resistance is measured during nighttime. However, the measurement may be performed during daytime as long as the short-circuited circuit including the input terminals 2a and 2b and the two-circuit interlocking type change-over switch 24 has a capacity that can withstand short-circuiting current of the connected solar cell array 1. However, in some systems, since the short-circuiting current becomes as high as several 10 amperes, the measurement is preferably performed during the nighttime even though the short-circuited circuit has a capacity that can withstand the current.

Embodiment 4

FIG. 4 shows still another embodiment of a solar light power generating system according to the present invention.

In this embodiment, a circuit for determining the location of a poor insulation portion is arranged as a circuit to be added to each of Embodiments 1 to 3. More specifically, voltage detectors 271 and 272 are arranged between the input terminals 2a and 2b and ground in the electric path from the inverter of the change-over switch 24. The voltage detectors 271 and 272 detect voltages on the lines of the electric path, and supply the detected voltages to the insulation judgement unit 253.

With this arrangement, the location of a poor insulation portion in the solar cell array 1 can be estimated in accordance with the difference between the voltage values detected by the two voltage detectors 271 and 272.

For example, when the resistances of the two resistors constituting the voltage dividing resistor 321 are 1 MΩ, and the solar cell array 1 is constituted by a series circuit of ten 20-V solar cell modules, if the input terminal 2a side is grounded with an insulator resistance of 100 kΩ, one voltage detector 271 indicates 0 V, and the other voltage detector 272 indicates 182 V. In contrast to this, when a poor insulation state occurs at the input terminal 2b side, the voltage detector 271 indicates 182 V, and the voltage detector 272 indicates 0 V. When a poor insulation state of 100 kΩ occurs in a cable between the third and fourth solar cell modules from the bottom, the voltage detector 271 indicates 127 V and the voltage detector 272 indicates 55 V. More specifically, by observing the voltage values of the two voltage detectors, a position, where the insulator resistance is lowered, of the solar cell array 1 can be estimated.

Therefore, if an abnormality is detected one day upon measurement of the insulator resistance during the nighttime, after the voltage of the solar cell array is sufficiently raised next day, the voltages are temporarily detected upon automatic or manual operation of the operating unit 251, and the location of a portion where the insulator resistance is lowered can be displayed on the display unit 28 on the basis of the voltage balance.

On the other hand, the voltage values measured during the daytime may be stored in a circuit comprising, e.g., a RAM, and when an abnormality is detected upon measurement of the insulator resistance during the nighttime, the information may be supplied to the converter control unit 22, and the location of a portion where the insulator resistance is lowered may be displayed on the display unit 28.

Embodiment 5

FIG. 5 shows still another embodiment of a dispersion type power generating system according to the present invention.

In this embodiment, a circuit for determining the location of a poor insulation portion is arranged as a circuit to be added to each of Embodiments 1 to 3. In this case, only the voltage detector 271 is inserted in the electric path from the inverter of the changer-over switch 24. The voltage detector 271 detects a voltage of one line of the electric path, and supplies the detected voltage to the insulation judgement unit 253. Furthermore, the insulation judgement unit 253 is provided with a memory circuit 29 such as a semiconductor memory, a magnetic storage device, or the like, and the memory circuit 29 stores the insulator resistance measured during the nighttime.

With this embodiment, when an abnormality is detected one day upon measurement of the insulator resistance during the nighttime, the measured insulator resistance is stored in the memory circuit 29, and after the voltage of the solar cell array is sufficiently raised next day, the voltage is temporarily detected, and the voltage balance in Embodiment 4 can be calculated based on the magnitude of the detected voltage and the stored insulator resistance. Based on the voltage balance, the location of a portion where the insulator resistance is lowered can be displayed on a liquid crystal display as the display unit 28.

Other operations are the same as those in Embodiment 4.

With this arrangement, the same effect as in Embodiment 4 can be obtained although the number of voltage detectors can be reduced to one.

Figure 6:
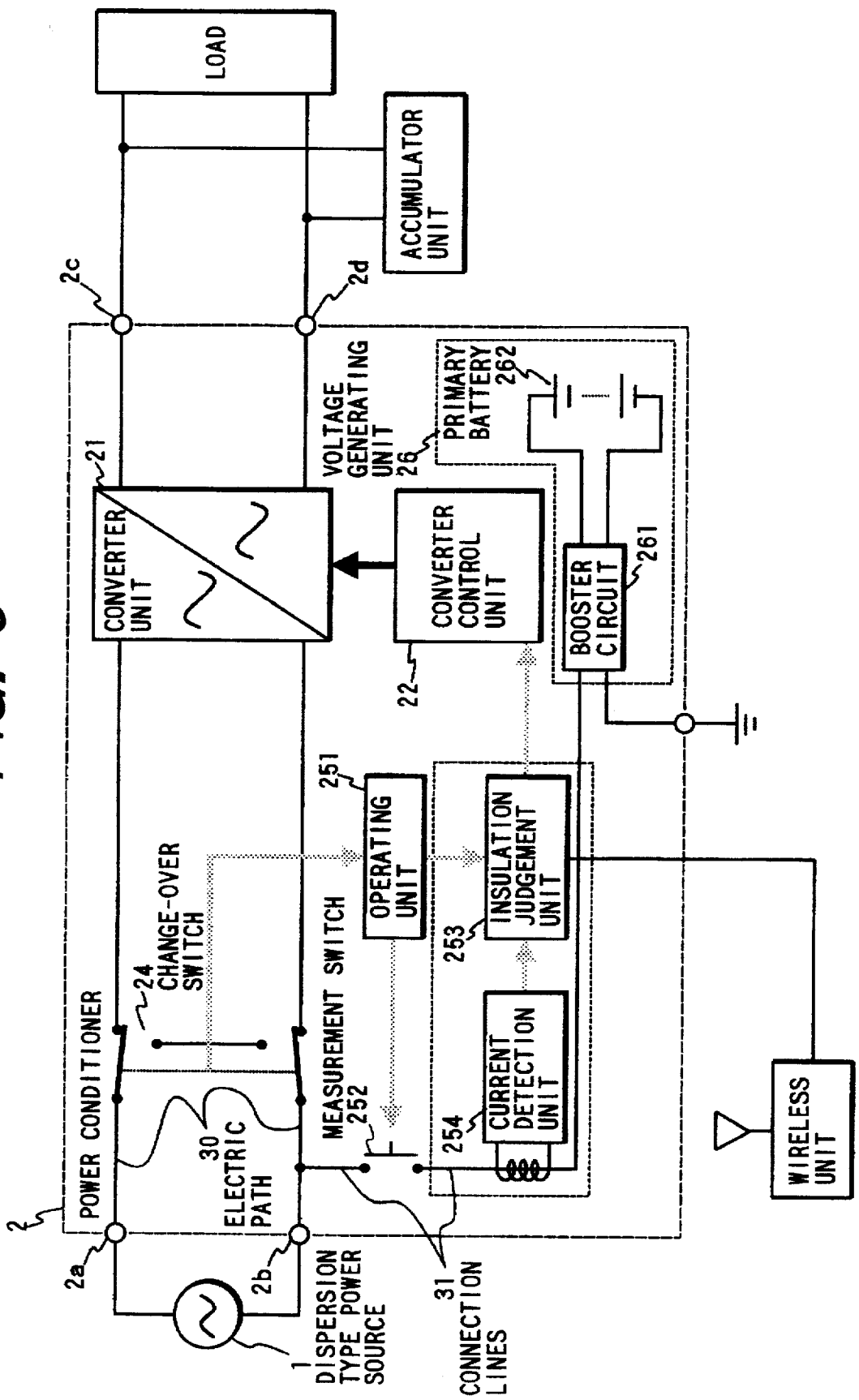
FIG. 6 is a block diagram showing still another arrangement of the present invention.

Embodiment 6 (FIG. 6)

This embodiment exemplifies an independent operating type power generating system to which an insulation judgement apparatus according to the present invention is applied.

This embodiment uses a wind power generator in place of the solar cell array in Embodiment 1.

In addition, in the converter unit, the DC-AC converter is replaced by an AC-DC converter accordingly.

A system serving as a load viewed from the power source is replaced by a load such as a normal accumulator unit and/or an illumination system.

In place of the display unit for displaying the insulation state, and the like, a signal indicating the insulation state is transmitted using a wireless unit, and the insulation state is displayed in another place.

In this embodiment as well, the insulation state can be judged as in Embodiment 1.

As described above, according to a first aspect of the invention, the power conversion system can manually and/or automatically measure and judge the insulation state of the electric path such as the electric path on the input side, power generator, solar cell panel, and the like without requiring any special attendance by a user. For this reason, an unexpected failure caused by a ground fault can be prevented, and a system which is very preferable in terms of assuring the safety of a user can be provided. As a result, a clean energy dispersion type power generating system such as a solar light power generating system can be widely used as a household appliance, and such a system can contribute to an improvement of the environment on the global scale.

According to a second aspect of the invention, in the insulation state judgement of the power conversion system, the insulator resistance is calculated based on the magnitude of the high voltage and the magnitude of the current, and the insulation state of the electric path or power source is judged based on the magnitude of the insulator resistance. Therefore, in addition to the effect of the first aspect, the measurement and judgement of the insulation state can be facilitated directly using the standard value of the insulator resistance. In addition, the system design is simplified.

According to a third aspect of the invention, whether or not the insulator resistance exceeds two different thresholds is judged. In addition to the effect of the second aspect, a poor insulation state can be detected stepwise. Such detection is preferable in terms of operation of the system.

According to a fourth aspect of the invention, since the electric path comprises a DC two-line electric path, the present embodiment can be applied to a general DC-AC conversion system, in addition to the effects of the embodiments of claims 1 to 3.

According to a fifth aspect of the invention, the magnitude of the insulator resistance measured by the insulation state measurement method described in claim 1 is stored. After the power source is connected again, a voltage between one line of the electric path and the grounded point is measured, and the location of a poor insulation portion is estimated on the basis of the magnitude of the detected voltage and the magnitude of the stored insulator resistance. For this reason, in addition to the effect of the second aspect, the position of a poor insulation portion in the power source can be estimated.

According to a sixth aspect of the invention, the insulation state can be measured while suppressing consumption of the power source used as voltage applying means.

According to a seventh aspect of the invention, the insulation state of the electric path can be judged using a simple system.

According to an eighth aspect of the invention, the present embodiment can be applied to a general DC-AC conversion system.

According to a ninth embodiment of the invention, a primary or secondary battery, which is relatively easily available, or a commercial power source as a stable power supply source can be used as a power source of the voltage applying means.

According to a tenth aspect of the invention, an insulation state monitoring apparatus for a power conversion system which has an electric path to one end of which a power source is connected, and short-circuits the power source in a non-ground state upon operation of short-circuit means, comprises a high-voltage generating power source for generating a DC or pulse-shaped high voltage, voltage applying means for applying the DC or pulse-shaped high voltage across the electric path and a grounded point, a connection line for connecting the high voltage applied by the voltage applying means to a point between the electric path and the grounded point, current detection means for detecting a current of the connection line, operating means for temporarily operating the voltage applying means after the short-circuit means is operated, and insulation judgement means for judging the insulation state of the electric path or the power source upon reception of the output from the current detection means. For this reason, the power conversion system can automatically judge the insulation state of the electric path such as the electric path on the input side, power generator, solar cell panel, and the like without requiring any special attendance by a user. For this reason, an unexpected failure caused by a ground fault can be prevented, and a system which is very preferable in terms of use management by a user can be provided. As a result, a clean energy dispersion type power generating system such as a solar light power generating system can be widely used as a household appliance, and such a system can contribute to an improvement of the environment on the global scale.

According to an eleventh aspect of the invention, since the electric path comprises a DC two-line electric path, the present embodiment can be applied to a general DC-AC conversion system, in addition to the effect of the tenth aspect.

According to a twelfth aspect of the invention, the DC two-line type electric path has one end to which a DC power source is connected as a power source, and the other end which is connected to a power distribution system via an inverter. For this reason, in addition to the effect of the eleventh aspect, the present embodiment can be applied to a general dispersion type power generating system. If the DC power source comprises a solar cell as in a thirteenth aspect of the invention, the present embodiment can be applied to a solar light power generating system, which has become increasingly popular. In addition, if the solar cell comprises a flexible solar cell module, the power generating system can be made more popular.

According to a fourteenth aspect of the invention, since the high-voltage generating power source comprises a booster circuit for boosting the voltage of the power distribution system, and a rectifier circuit for rectifying an output from the booster circuit, a troublesome exchange operation of, e.g., a primary cell can be omitted.

According to a fifteenth aspect of the invention, in the DC two-line electric path, voltage detectors are respectively inserted between one electric path line and the grounded point, and between the other electric path line and the grounded point, and the insulation judgement means estimates the location of a poor insulation portion upon reception of the outputs from the voltage detectors. In addition to the effect of the eleventh aspect of the invention, the location of a poor insulation portion in long solar cell modules or a rough poor insulation position in a complicated power source device can be easily estimated.

According to the eleventh aspect of the invention, in the DC two-line electric path, a voltage detector is inserted between one electric path line and the grounded point, means for storing the magnitude of the insulator resistance calculated by the insulation state judgement method is arranged, and the insulation judgement means estimates the location of a poor insulation portion upon reception of the output from the voltage detector and the stored magnitude of the insulator resistance. For this reason, in addition to the effect of the the eleventh aspect, the location of a poor insulation portion in long solar cell modules or a rough poor insulation position in a complicated power source device can be easily estimated by a simple circuit.

According to a seventeenth aspect of the invention, since the insulating performance of a resin changes over time, a period after which a poor insulation state occurs can be roughly estimated in advance.

According to yet another aspect, the invention can be conveniently applied as a dispersion type power generating system or an independent power generating system.

What is claimed is:

1. A method for determining an insulating state of a power source comprising the steps of:

providing a circuit comprising power conversion means for converting an input power into a different power and the power source, said power conversion means and said power source being connected through an electric path, forming a short circuit by said power source and said electric path and forming an open circuit by said power conversion means and said electric path;

applying a voltage to said short circuit;

measuring a current produced by said applied voltage; and determining an insulating state of said power source based on a current value measured in said current measuring step.

2. A method according to claim 1, further comprising the steps of:

calculating an insulating resistance based on the voltage applied during the voltage applying step and the current value measured in the current measuring step; and determining the insulating state of said power source.

3. A method according to claim 2, wherein the measurement is performed on the basis of whether or not the insulator resistance exceeds two different thresholds.

4. A method according to claim 2, further comprising the steps of:

after storing the insulating resistance value, cancelling the short circuit of said power source and connecting to said power conversion means again, a voltage on said electric path is measured, and then locating a poor insulating section based on the voltage value and the insulating resistance value.

5. A method according to claim 1, wherein the electric path comprises a DC two-line electric path.

6. A method according to claim 1, wherein the voltage application time falls within a range from 2 to 5 seconds.

7. An apparatus for determining an insulating state of a power source comprising:

means provided with a circuit comprising power conversion means for converting an input power into a different power output and the power source, said power conversion means being connected through an electric path to said power source, for forming a short circuit by said power source and said electric path in the circuit, and for forming an open circuit by said power conversion means and said electric path;

voltage applying means for applying a voltage to said short circuit;

current measuring means for measuring a current generated by the applied voltage; and means for determining the insulating state of said power source based on the current value measured by said current measuring means.

8. A device according to claim 7, wherein the electric path comprises a DC two-line electric path.

9. A device according to claim 7, wherein said voltage applying means comprises as a source at least one of a primary battery, a secondary battery, and a commercial power supplying system.

10. A power generating system comprising:

means, provided with power conversion means for converting an input D.C. power into an A.C. power output and a D.C. power source, said power conversion means and said D.C. power source being connected through a D.C. two wire electric path, for forming a short circuit by said D.C. power source and said D.C. two wire electric path, and for forming an open circuit by said power conversion means and said D.C. two wire electric path;

voltage applying means for applying a voltage to said short circuit;

current measuring means for measuring a current generated by the applied voltage;

means for determining an insulating state of said D.C. power source based on a value of the current measured by said current measuring means; and monitor means for monitoring a result of the determining by said determining means.

11. A system according to claim 10, wherein the DC two-line type electric path has one end to which a DC power source is connected as the power source, and another end which is connected to a load via converter means.

12. A system according to claim 11, wherein, in the DC two-line type electric path, a voltage detector is inserted between one electric path line and the grounded point, said system further comprises memory means for storing an insulator resistance value calculated by an insulation state judgement method, and said insulation judgement means estimates a location of a poor insulation portion upon reception of an output from said voltage detector, and the stored insulator resistance value.

13. A system according to claim 11, wherein the load comprises a power distribution system.

14. A system according to claim 11, wherein the load comprises accumulator means.

15. A system according to claim 11, wherein the DC power source comprises a solar cell.

16. A system according to claim 15, wherein the solar cell comprises a flexible solar cell module.

17. A system according to claim 15, wherein the solar cell comprises a resin-encapsulated solar cell module.

18. A system according to claim 10, further comprising means for boosting a voltage generated by said voltage applying means.

19. A system according to claim 10 wherein, in the DC two-line type electric path, voltage detectors are inserted between one electric path line and the grounded point and between the other electric path line and the grounded point, and said insulation judgement means estimates a location of a poor insulation portion upon reception of outputs from said voltage detectors.

20. A system according to claim 10, wherein said monitor means comprises display means.

21. A system according to claim 10, wherein said monitor means comprises display means for displaying a warning based on a result obtained by said determining means.

* * * * *

UNITED STATES PATENT AND TRADEMARK OFFICE
CERTIFICATE OF CORRECTION

PATENT NO. : 5,712,572
DATED : January 27, 1998
INVENTOR(S) : MASANARI TAMECHIKA, ET AL.

Page 1 of 3

It is certified that error appears in the above-identified patent and that said Letters Patent is hereby corrected as shown below:

On the title page, item [56]

Insert

--OTHER PUBLICATIONS

"Photovoltaic Electrical System Design Practice; Issues and Recommendations" by T. Key et al., 19th IEEE Photovoltaic Specialists Conf., May 1987, U.S. pgs. 1128-1133.--

ABSTRACT

Replace the existing text with the following:

--The insulative state of a power source is determined in a system in which a power converter connected to the power source through an electric path converts input power from the power source to a different type of power. A short circuit is formed by the power source and the electric path and an open circuit is formed by the power converter and the electric path. A voltage is applied to the short circuit and the current produced by the applied voltage between the short circuit and a ground is measured. The insulative state of the power source is determined from the measured current.--

COLUMN 5

Line 32, "(FIG. 2)" should read --(FIG. 4)--; and
Line 63, "Lines" should read --Lines 31--.

UNITED STATES PATENT AND TRADEMARK OFFICE
CERTIFICATE OF CORRECTION

PATENT NO. : 5,712,572
DATED : January 27, 1998
INVENTOR(S) : MASANARI TAMECHIKA, ET AL.

Page 2 of 3

It is certified that error appears in the above-identified patent and that said Letters Patent is hereby corrected as shown below:

COLUMN 13

Line 15, "into" should read --from the power source into-- and "different power" should read --different type of power--;

Line 16, "and the power source" should be deleted;

Line 53, "power into" should read --power from the power source into--; and

Line 54, "ferent" should read --ferent type of-- and "output and the power source" should be deleted.

UNITED STATES PATENT AND TRADEMARK OFFICE
CERTIFICATE OF CORRECTION

PATENT NO. : 5,712,572
DATED : January 27, 1998
INVENTOR(S) : Masanari Tamechika, et al.

It is certified that error appears in the above-identified patent and that said Letters Patent is hereby corrected as shown below:

COLUMN 11

Line 32, "embodi-" should read --first, second and third aspects.--; and
Line 33, "ments of claims 1 to 3." should be deleted.

COLUMN 12

Line 58, "the eleventh" should read --a sixteenth--; and
Line 67, "the" (second occurrence) should be deleted.

Signed and Sealed this

Fifteenth Day of September, 1998

Attest:

BRUCE LEHMAN

*Attesting Officer*  *Commissioner of Patents and Trademarks*